(12) United States Patent
Despesse et al.

(10) Patent No.: US 9,671,435 B2
(45) Date of Patent: Jun. 6, 2017

(54) DIFFERENTIAL VOLTAGE MEASUREMENT CIRCUIT

(71) Applicant: Commissariat A L'Energie Atomique Et Aux Energies Alternatives, Paris (FR)

(72) Inventors: Ghislain Despesse, Saint Egreve (FR); Sylvain Lechat Sanjuan, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 316 days.

(21) Appl. No.: 14/029,059

(22) Filed: Sep. 17, 2013

(65) Prior Publication Data

US 2014/0079970 A1   Mar. 20, 2014

(30) Foreign Application Priority Data

Sep. 19, 2012   (FR) ...................................... 12 58787

(51) Int. Cl.
*G01R 19/00* (2006.01)
*G01R 31/36* (2006.01)
*G01R 19/165* (2006.01)
*G01R 19/10* (2006.01)

(52) U.S. Cl.
CPC ............. *G01R 19/00* (2013.01); *G01R 19/10* (2013.01); *G01R 19/16542* (2013.01); *G01R 31/3606* (2013.01)

(58) Field of Classification Search
CPC .. G01R 19/00; G01R 19/10; G01R 19/16542; G01R 31/3606
See application file for complete search history.

(56) References Cited

U.S. PATENT DOCUMENTS 3,925,718 A * 12/1975 Wittlinger ............... H03F 3/345
                                                         323/315
6,091,226 A     7/2000 Amano
2006/0250166 A1* 11/2006 Sack .................. G01R 19/2503
                                                         327/77

FOREIGN PATENT DOCUMENTS

WO    2009020566 A1   2/2009

OTHER PUBLICATIONS

Search Report issued in French Application No. 12/58787 on Jun. 12, 2013.

* cited by examiner

*Primary Examiner* — Patrick Ryan
*Assistant Examiner* — Ben Lewis
(74) *Attorney, Agent, or Firm* — Moreno IP Law LLC

(57) ABSTRACT

A voltage measurement circuit including a current mirror having an input branch in series with a first resistive element between first and second nodes of application of said voltage, and having an output branch providing a current representative of said voltage.

12 Claims, 5 Drawing Sheets

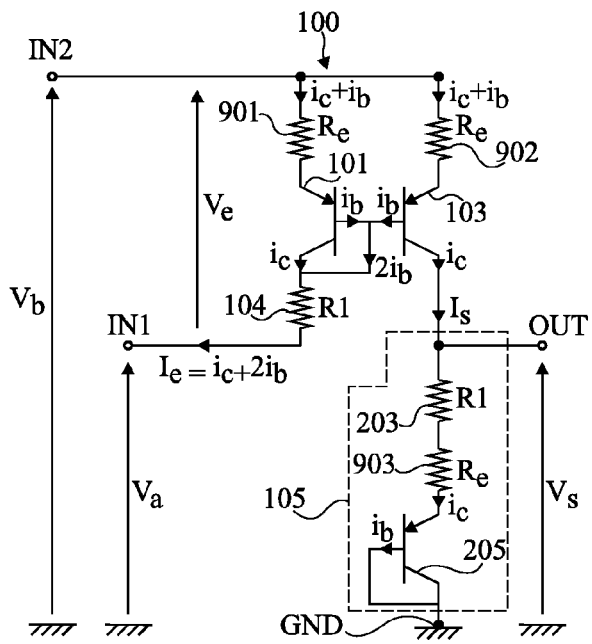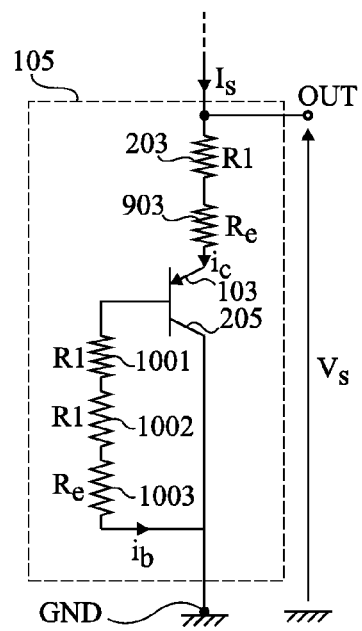
Fig 9            Fig 10
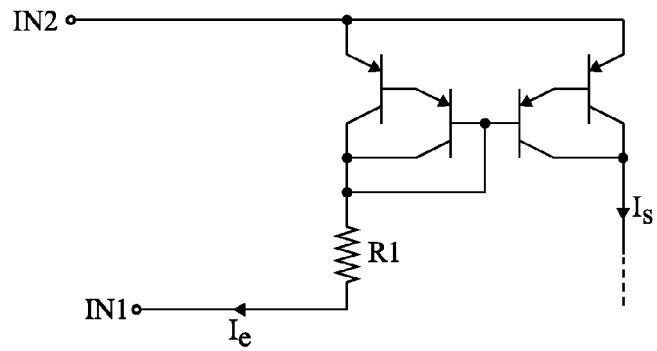
Fig 11
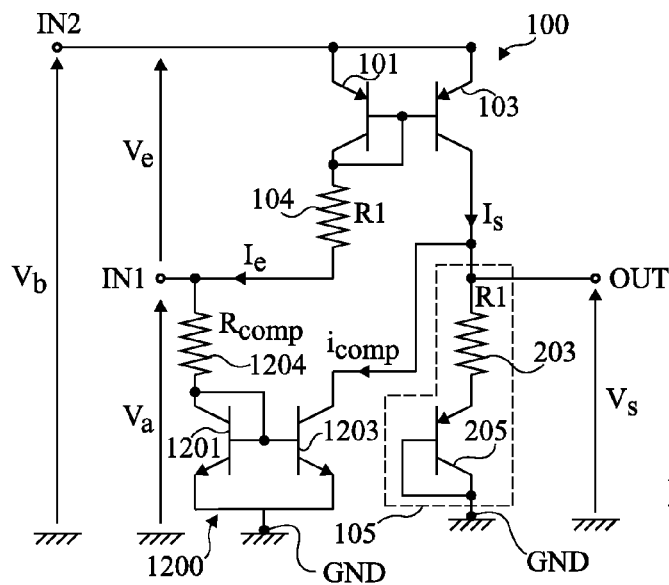
Fig 12

DIFFERENTIAL VOLTAGE MEASUREMENT CIRCUIT

BACKGROUND

The present disclosure relates to a differential voltage measurement circuit. It especially aims at the use of such a circuit to measure the voltage provided by a voltage generation cell in an electric circuit comprising a plurality of series-connected generation cells, for example, an electric battery.

DISCUSSION OF THE RELATED ART

An electric battery is a group of several elementary cells (cells, accumulators, etc.) series-connected between two nodes or terminals for providing a D.C. voltage. In certain applications, for example, in the field of batteries for electric vehicles, circuits are provided to measure and control the voltage of elementary cells. Known measurement circuits use differential amplifiers. However, all along the chain, the cells have higher and higher common-mode voltages, whereby it becomes necessary to use differential amplifiers powered with a voltage greater than or equal to the full battery voltage. This is not always possible and, when it is, causes a relatively high power consumption by the measurement circuits, and increases the cost of the battery. Another solution comprises, for cells having a high common-mode voltage, taking the high and low voltages of the cell to lower values by means of a pair of resistors of same values, or of a pair of dividing bridges having the same division ratio, and performing the differential voltage measurement downstream of the resistors. This enables to use measurement circuits powered with a voltage lower than the full battery voltage, but has the disadvantage of substantially decreasing the accuracy of the measurement, especially due to the error margins which exist for the values of the resistors (the loss of accuracy being all the greater as the division ratio is high). Further, in known battery management boards, there are risks of degradation and/or electrocution due to the fact that input terminals directly receive the voltage of the battery cells.

SUMMARY

Thus, an object of an embodiment of the present invention is to provide a differential voltage measurement circuit overcoming at least some of the disadvantages of existing circuits.

An object of an embodiment of the present invention is to provide a differential voltage measurement circuit which is less expensive than existing circuits.

An object of an embodiment of the present invention is to provide a differential voltage measurement circuit with a lower power consumption than existing circuits.

An object of an embodiment of the present invention is to provide a differential voltage measurement circuit which is more accurate than existing circuits.

Thus, an embodiment of the present invention provides a voltage measurement circuit, comprising a current mirror having an input branch series-connected with a first resistive element between first and second nodes of application of the voltage, and having an output branch providing a current representative of the voltage.

According to an embodiment, the output branch is located between the first node and a third node of application of a reference voltage.

According to an embodiment, the voltage measurement circuit further comprises an element for converting the current into an output voltage.

According to an embodiment, the conversion element comprises a second resistive element of same value as the first resistive element and, series-connected with the second resistive element, a branch identical to the input branch of the current mirror.

According to an embodiment, the current mirror comprises transistors.

According to an embodiment, each transistor of the current mirror is series-connected with a resistor.

According to an embodiment, the transistors of the current mirror are bipolar transistors, the voltage measurement circuit further comprising a circuit for compensating the base current of the transistors of the current mirror.

According to an embodiment, the voltage measurement circuit further comprises a circuit for compensating the effect of the common mode on the output branch of the current mirror.

Another embodiment provides an electric battery comprising a plurality of series-connected elementary cells and, across at least one elementary cell, a measurement circuit of the above-mentioned type.

According to an embodiment, the measurement circuit is used to control the voltage of said cell.

The foregoing and other features and advantages of the present invention will be discussed in detail in the following non-limiting description of specific embodiments in connection with the accompanying drawings.

BRIEF DESCRIPTION OF THE DRAWINGS

FIGS. 9 to 12 are partial electric diagrams illustrating alternative embodiments of a differential voltage measurement circuit;

For clarity, the same elements have been designated with the same reference numerals in the different drawings. Further, only those elements which are useful to the understanding of the present invention have been shown and described.

DETAILED DESCRIPTION

Figure 1:
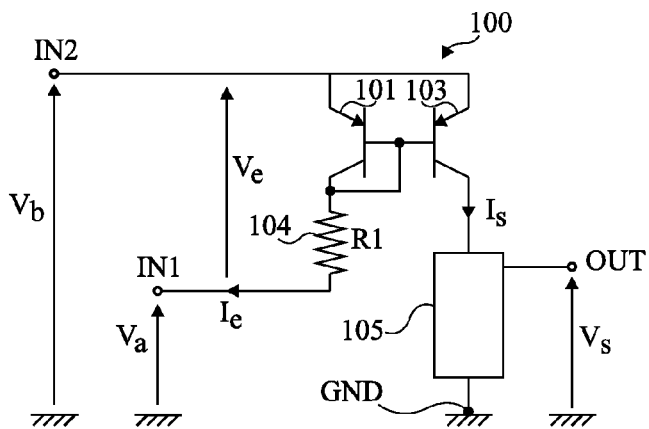
FIG. 1 is an electric diagram showing an embodiment of a differential voltage measurement circuit.

FIG. 1 is an electric diagram showing an embodiment of a differential voltage measurement circuit. The circuit of FIG. 1 comprises a current mirror 100 having its input branch comprising a bipolar transistor 101 assembled as a diode (base and collector connected), and having its output branch comprising a bipolar transistor 103 having its base connected to the base of transistor 101. In the shown example, transistors 101 and 103 are PNP transistors. The emitters of transistors 101 and 103 are connected to a node IN2 of application of high potential $V_b$ of a differential voltage $V_e$ to be measured. The collector of transistor 101 is connected to a node IN1 of application of low potential $V_a$ of voltage $V_e$ ($V_e=V_b-V_a$) via a resistive element 104 of value R1. The collector of transistor 103 is connected to a node GND of application of a reference potential, for example, the ground, possibly via a current-to-voltage conversion element 105.

When a positive voltage $V_e$ ($V_b>V_a$) is applied between terminals IN1 and IN2, there flows, in the input branch of mirror 100, a current $I_e$ proportional to $V_e$ minus the threshold voltage of transistor 101 and, in the output branch of mirror 100, a current $I_s$ equal to current $I_e$. Current $I_s$ is representative of the differential input voltage. It may be measured by circuits (not shown) powered with a voltage lower than high potential $V_b$ of differential voltage $V_e$. Resistor 104 enables to adjust the relation between current $I_s$ and differential voltage $V_e$. Current $I_s$ may be either directly digitized by means of an analog-to-digital converter (not shown), or transformed, by converter 105, into a voltage $V_s$, which is an image of voltage $V_e$ but which has its low potential taken down to ground, provided between reference node GND and an output node OUT of converter 105.

The uses that can be made of current $I_s$ or of voltage $V_s$ (digitization, control of a battery cell control circuit, etc.) will not be thoroughly described, the provided embodiments being compatible with current uses of differential measurement circuits.

An advantage of the circuit of FIG. 1 is that it is simpler to form and less expensive than existing differential measurement circuits. Such a circuit indeed enables, in its simpler version, to perform a differential measurement by means of a single current mirror (two transistors 101 and 103) and of two resistors (R1 and R2). Further, in the case of a use to measure the voltage provided by a cell of an electric battery, this circuit requires neither a power supply with the full battery voltage, nor a lowering of the high and low potentials of the voltage to be measured by means of a pair of identical resistive voltage dividing bridges. Further, risks of degradation and/or of electrocution during handling operations are decreased. This also enables to protect other circuits capable of being referenced to the same ground potential GND as the differential measurement circuit. The circuit of FIG. 1 is thus more power efficient, more accurate, and more secure than existing circuits.

Figure 2A:
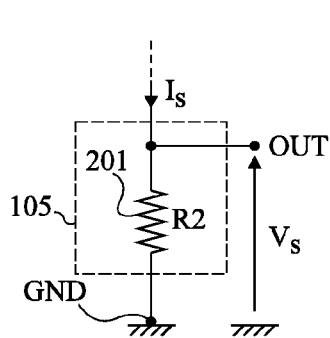
FIGS. 2A to 2C are partial electric diagrams illustrating alternative embodiments of a differential voltage measurement circuit.
Figure 2B:
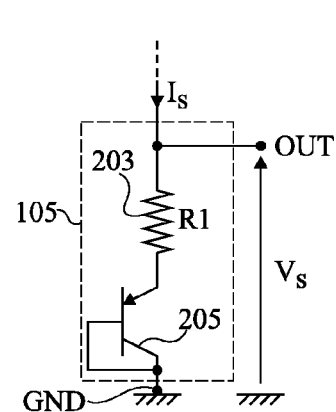
Figure 2C:
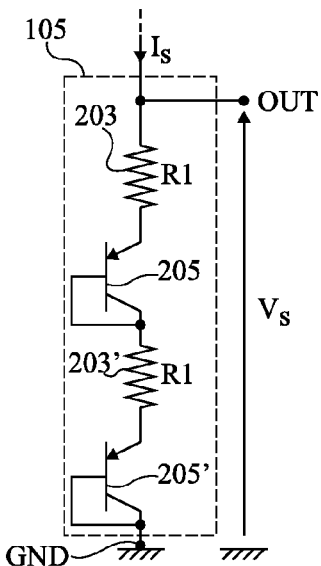

FIGS. 2A to 2C are partial electric diagrams illustrating embodiments of current-to-voltage converter 105 of FIG. 1.

In the example of FIG. 2A, converter 105 comprises a resistive element 201 of value R2, for example, a resistor, connecting node OUT to node GND. Node OUT is connected to the collector of transistor 103. Ratio R2/R1 sets the relation between output voltage $V_s$ and input voltage $V_e$ minus the threshold voltage of transistor 101.

In the example of FIG. 2B, converter 105 comprises, in series between node OUT and node GND, a resistor 203 of same value R1 as resistor 104 (FIG. 1), and a diode-assembled transistor 205, identical to transistor 101 (FIG. 1). Node OUT is connected to the collector of transistor 103. Resistor 203 is placed between node OUT and the emitter of transistor 205, and the collector of transistor 205 is connected to node GND. The impedance of current-to-voltage converter 105 (a diode-assembled PNP transistor+a resistor of value R1) is thus identical to the input impedance of the differential measurement circuit. As a result, in the measurement circuit operating range, output voltage $V_s$ is equal to input voltage $V_e$.

In the example of FIG. 2C, converter 105 comprises the same elements as in the example of FIG. 2B, and further comprises, in series between the collector of transistor 205 and node GND, a resistor 203' identical to resistor 203, and a diode-assembled transistor 205' identical to transistor 205. Resistor 203' is placed between the collector of transistor 205 and the emitter of transistor 205', and the collector of transistor 205 is connected to node GND. The impedance of current-to-voltage converter 105 is thus equal to twice the input impedance of the differential measurement circuit. As a result, in the operating range of the measurement circuit, output voltage $V_s$ is equal to twice input voltage $V_e$. It should be noted that in this example, resistors 203 and 203' may be replaced with a single resistor of value 2R1. Generally, it is however advantageous to use identical components in the input branch of the measurement circuit and in current-to-voltage conversion circuit 105, since this especially enables to guarantee the symmetry of behavior variations according to temperature in the two branches.

Figure 3:
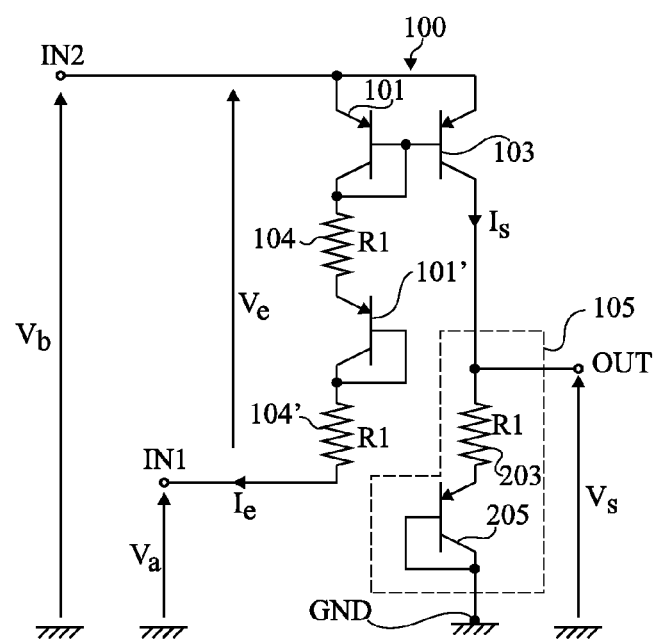
FIG. 3 is an electric diagram showing another alternative embodiment of a differential voltage measurement circuit.

FIG. 3 is an electric diagram illustrating another alternative embodiment of the differential measurement circuit of FIG. 1. The circuit of FIG. 3 comprises the same elements as the circuit of FIG. 1, and, in the shown example, current-to-voltage converter 105 is the same as in the example of FIG. 2B. The circuit of FIG. 3 further comprises, between resistor 104 and node IN1 and in series with transistor 101 and resistor 104, a diode-assembled transistor 101' identical to transistor 101, and a resistor 104' identical to resistor 104. The emitter of transistor 101' is connected to resistor 104, and the collector of transistor 101' is connected to node IN1 via resistor 104'. The impedance of current-to-voltage converter 105 is thus equal to half the input impedance of the differential measurement circuit. As a result, in the operating range of the measurement circuit, output voltage $V_s$ is equal to half input voltage $V_e$.

It will be within the abilities of those skilled in the art, according to the targeted use, to provide other impedance ratios between the differential input of the measurement circuit and current-to-voltage conversion element 105, to obtain other relations, linear or non-linear, between output voltage $V_s$ and input voltage $V_e$.

The circuits described in relation with FIGS. 1 to 3 are intended to operate when voltage $V_e=V_b-V_a$ to be measured is positive (and greater than the threshold voltage of transistor 101). In certain applications, for example, when the differential voltage to be measured is an A.C. voltage, or when the assembly of the measurement circuit is desired to be made easier by avoiding to differentiate its high input terminal from its low input terminal, the sign of voltage Ve is not known in advance.

Figure 4:
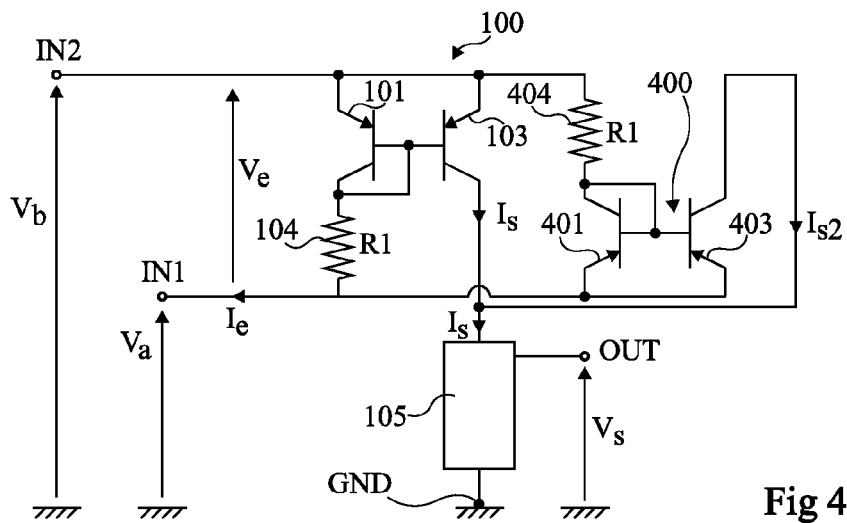
FIG. 4 is an electric diagram showing an embodiment of a differential voltage measurement circuit capable of operating whatever the sign of the voltage applied thereacross.

FIG. 4 is an electric diagram showing an embodiment of a differential voltage measurement circuit capable of operating whatever the sign of voltage $V_e$ applied thereacross. The circuit of FIG. 4 comprises the same elements as the circuit of FIG. 1, and further comprises, between input nodes IN1 and IN2, a second current mirror 400, identical to mirror 100, and a second input resistor 404, identical to resistor 104. Mirror 400 and resistor 404 are connected in the same way as mirror 100 and resistor 104, input nodes IN1 and IN2 being however inverted. Mirror 400 comprises, in its input branch, a diode-assembled transistor 401, identical to transistor 101, and in its output branch, a transistor 403 identical to transistor 103, having its base connected to the base of transistor 401. The emitters of transistors 401 and 403 are connected to input node IN1. The collector of transistor 401 is connected to node IN2 via resistor 404. The collector of transistor 403 is connected to the collector of transistor 103.

When a positive voltage $V_e$ ($V_b > V_a$) is applied between terminals IN1 and IN2, transistor 401, reverse-biased, is blocked. Current mirror 400 is thus inactive. A positive output current $I_s$, representative of voltage $V_e$, is generated by current mirror 100, which is active. When a negative voltage $V_e$ ($V_b < V_a$) is applied between terminals IN1 and IN2, transistor 101, reverse-biased, is blocked. Current mirror 100 is thus inactive. A positive output current $I_s$, representative of voltage $V_a - V_b$, is generated by current mirror 400, which is active. Thus, whatever the sign of differential voltage $V_e$ applied as an input, the circuit of FIG. 4 provides a value $I_s$ or $V_s$ representative of the absolute value of $V_e$.

The circuits described in relation with FIGS. 1 to 4 are intended to operate when common mode $V_c = (V_a + V_b)/2$ of voltage $V_e$ to be measured is positive with respect to the potential of node GND (or, more generally, when the highest potential of voltage $V_e$ to be measured is greater than the potential of node GND by a value at least equal to the saturation voltage of output transistor 103 or 403 of the current mirror).

Circuits enabling to measure a voltage $V_e$ having a negative common mode may be obtained by replacing, in the circuits described in relation with FIGS. 1 to 4, the PNP bipolar transistors with NPN bipolar transistors, without changing the emitter, base, and collector connections with respect to the circuits of FIGS. 1 to 4, but by inverting the high and low input nodes with respect to the circuits of FIGS. 1 to 4. In this case, output current $I_s$ representative of input voltage $V_e$ is a negative current (positive current running from node GND to output transistor 103 or 403 of the current mirror). If the measurement circuit is desired to provide a output voltage $V_s$ positive with respect to the reference potential of node GND, it may be provided to include an inversion function in current-to-voltage conversion element 105.

Figure 5A:
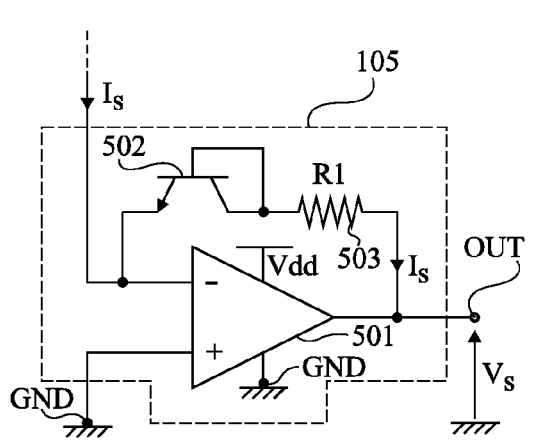
FIGS. 5A and 5B are partial electric diagrams illustrating alternative embodiments of a differential voltage measurement circuit capable of operating when a differential voltage of negative common mode is applied thereacross.
Figure 5B:
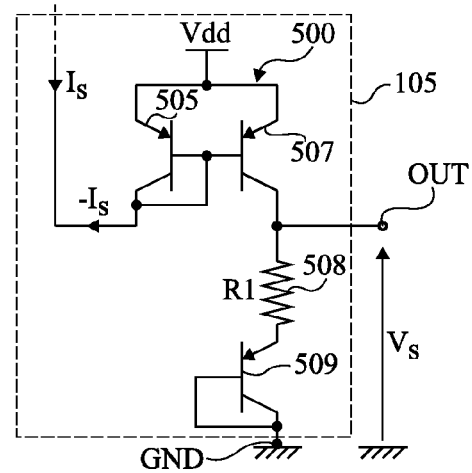

FIGS. 5A and 5B are partial electric diagrams illustrating embodiments of a current-to-voltage converter 105 including an inversion function.

In the example of FIG. 5A, circuit 105 comprises an operational amplifier 501 assembled as an inverter. Amplifier 501 comprises a low power supply terminal connected to ground GND, and a high power supply terminal receiving a high power supply voltage $V_{dd}$, for example, on the order of 3 V. The non-inverting input (+) and the inverting input (−) of amplifier 501 are respectively connected to node GND and to the collector of the output transistor of the current mirror of the measurement circuit (transistor 103/403 not shown in FIG. 5A). The output of amplifier 501 is connected to node OUT. A feedback loop connects the output of amplifier 501 to the inverting input. In the shown example, the feedback loop comprises a resistor 503 identical to resistors 104/404 (not shown in FIG. 5A), series-connected to a diode-assembled transistor 502, identical to transistors 101/401 (not shown in FIG. 5A). The emitter of transistor 502 is connected to the inverting input of amplifier 501, and resistor 503 connects the collector of transistor 502 to the output of amplifier 501. The impedance of the feedback loop is thus identical to the input impedance of the differential measurement circuit. As a result, in the measurement circuit operating range, output voltage $V_s$ is positive and equal to input voltage $V_e$ (or to the absolute value of $V_e$ in the case of the circuit of FIG. 4). Different impedance ratios between the feedback loop and the input of the measurement circuit may be provided to obtain different relations between voltage $V_s$ and voltage $V_e$.

In the example of FIG. 5B, circuit 105 comprises a current mirror 500 having its input branch comprising a diode-assembled PNP transistor 505 and having its output branch comprising a PNP transistor 507 having its base connected to the base of transistor 505. The emitters of transistors 505 and 507 are connected to a positive power supply rail $V_{dd}$. The collector of transistor 505 is connected to the collector of the output transistor of the current mirror of the measurement circuit (transistor 103/403 not shown in FIG. 5B). The collector of transistor 507 is connected to node OUT. Node OUT is connected to reference node GND via a resistor 508 identical to resistors 104/404 (not shown in FIG. 5B), in series with a diode-assembled transistor 509, identical to transistors 101/401 (not shown in FIG. 5A). The emitter of transistor 509 is connected to node OUT via resistor 508. The collector of transistor 509 is connected to node GND. The impedance of the branch located between node OUT and node GND is thus identical to the input impedance of the differential measurement circuit. In the measurement circuit operating range, current $I_s$ provided by the measurement circuit is inverted by current mirror 500, and output voltage $V_s$ is thus positive and equal to input voltage $V_e$ (or to the absolute value of $V_e$ in the case of the circuit of FIG. 4). Different impedance ratios between conversion circuit 105 and the input of the measurement circuit may be provided to obtain different relations between voltage $V_s$ and voltage $V_e$.

Figure 6:
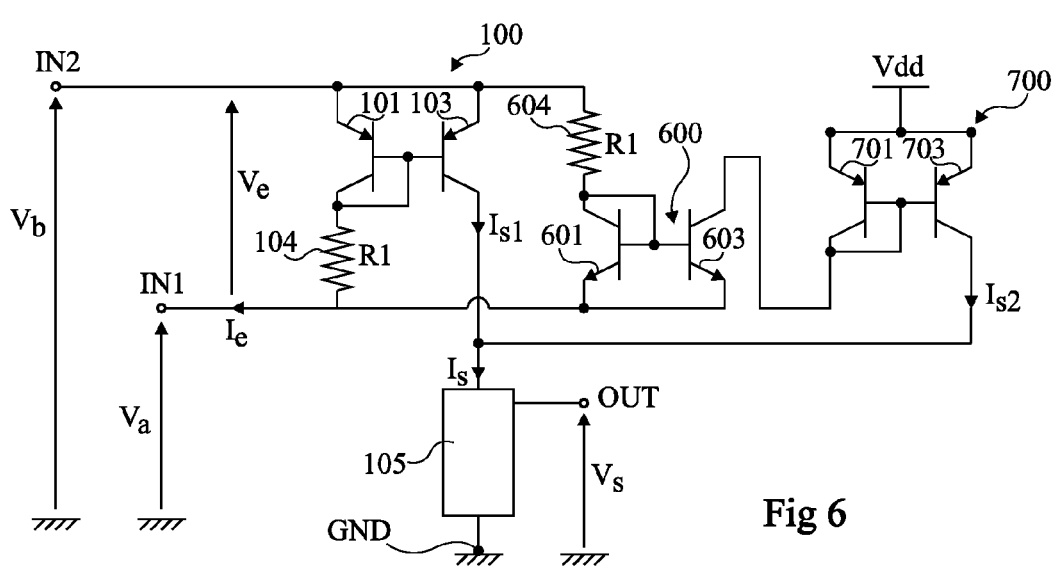
FIG. 6 is an electric diagram showing an embodiment of a differential voltage measurement circuit capable of operating whatever the sign of the common mode of the voltage to be measured.

FIG. 6 is an electric diagram showing an embodiment of a differential voltage measurement circuit capable of operating whatever the sign of the common mode of voltage $V_e$ to be measured. The circuit of FIG. 6 comprises the same elements as the circuit of FIG. 1, and further comprises, between input nodes IN1 and IN2, a second current mirror 600 and a second input resistor 604, identical to resistor 104. Current mirror 600 differs from current mirror 100 in that it is formed with NPN bipolar transistors rather than with PNP transistors. Mirror 600 comprises, on its input branch, a diode-assembled NPN transistor 601 and, on its output branch, an NPN transistor 603 having its base connected to the base of transistor 601. The emitters of transistors 601 and 603 are connected to input node IN1. The collector of transistor 601 is connected to node IN2 via resistor 604. The circuit of FIG. 6 further comprises a third current mirror 700 having the function of inverting the negative current provided at the output of mirror 600 when a negative common-mode voltage $V_e$ is applied at the input of the measurement circuit. Mirror 700 comprises, on its input branch, a diode-assembled PNP transistor 701 and, on its output branch, a PNP transistor 703 having its base connected to the base of transistor 701. The emitters of transistors 701 and 703 are connected to a positive power supply rail $V_{dd}$. The collector of transistor 701 is connected to the collector of transistor 603. The collector of transistor 703 is connected to the collector of transistor 103.

When a positive voltage $V_e$ ($V_b > V_a$) having a positive common mode is applied between terminals IN1 and IN2, current mirror 100 is active and mirrors 600 and 700 are inactive (especially since transistor 603 is reverse biased, or forward biased but at a voltage lower than its conduction threshold). Mirror 100 delivers a positive current $I_{s1}$ representative of input voltage $V_e$. When a positive voltage $V_e$ having a negative common mode is applied between terminals IN1 and IN2, mirror 100 is inactive and mirrors 600 and 700 are active. Mirror 700 delivers a positive current $I_{s2}$ representative of input voltage $V_e$.

Figure 7:
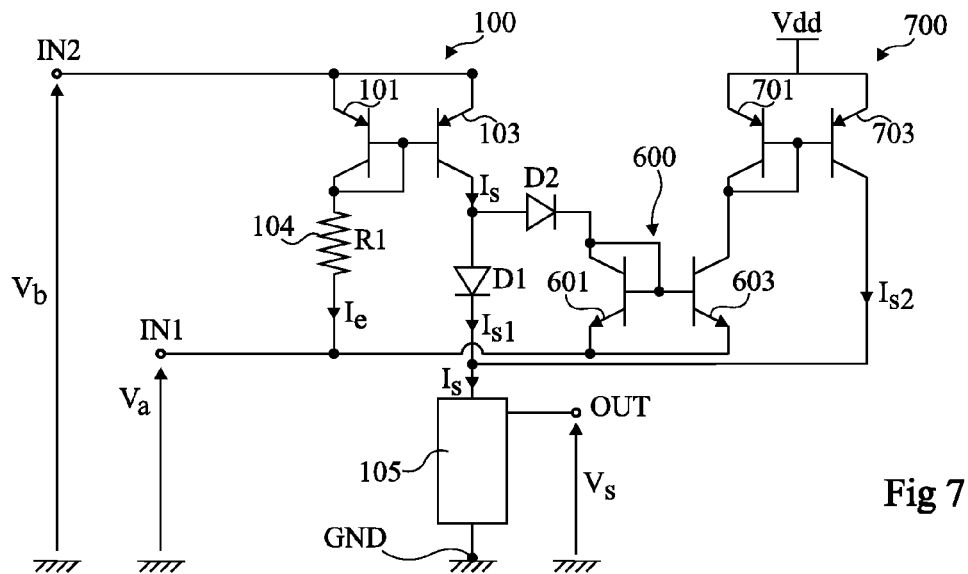
FIG. 7 is an electric diagram showing an alternative embodiment of a differential voltage measurement circuit capable of operating whatever the sign of the common mode of the voltage to be measured.

FIG. 7 is an electric diagram showing an alternative embodiment of a differential voltage measurement circuit capable of operating whatever the sign of the common mode of the voltage to be measured. The circuit of FIG. 7 differs from the circuit of FIG. 6 in that, in the circuit of FIG. 6, a resistor of value R1 is provided at the input of each of current mirrors 100 and 600 (resistors 104 and 604, respectively), while in the circuit of FIG. 7, this resistor is shared. In the circuit of FIG. 7, resistor 604 is not present and the collector of transistor 601, instead of being connected to the emitter of transistor 103, is connected to its collector, via a diode D2 having its anode on the collector side of transistor 103. Further, a diode D1 is provided between the collector of transistor 103 and current-to-voltage conversion circuit 105, the anode of diode D1 being on the collector side of transistor 103.

Figure 8:
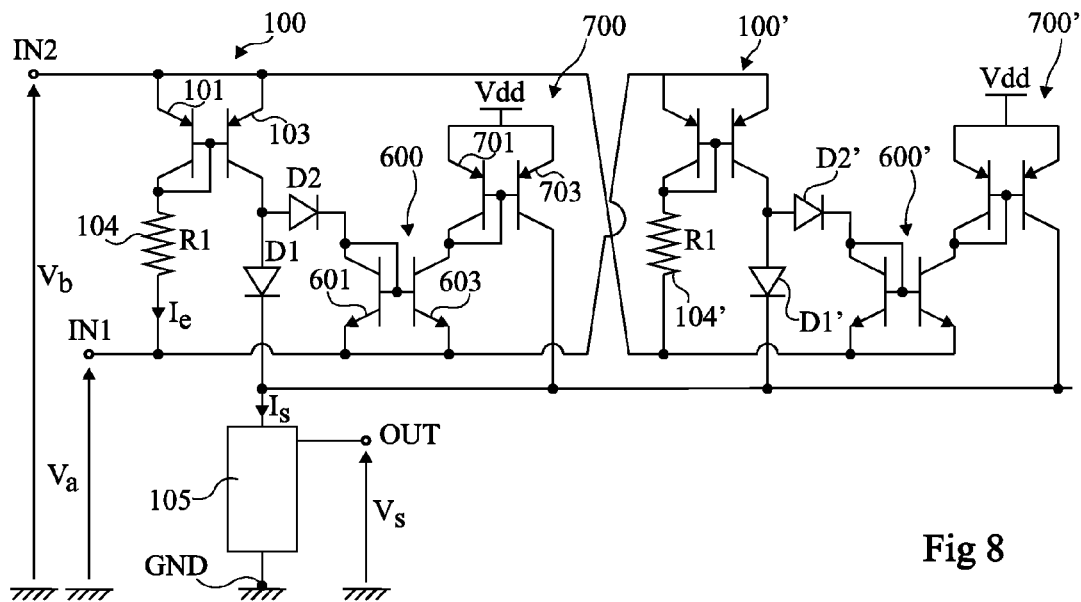
FIG. 8 is an electric diagram showing an embodiment of a differential voltage measurement circuit capable of operating whatever the sign of the voltage applied thereacross and whatever the sign of the common mode of this voltage.

FIG. 8 is an electric diagram showing an embodiment of a differential voltage measurement circuit capable of operating whatever the sign of voltage $V_e$ to be measured and whatever the sign of the common mode of this voltage. The circuit of FIG. 8 corresponds to the circuit of FIG. 7, where resistor 104, diodes D1 and D2, and current mirrors 100, 600, and 700 have been duplicated. The duplicated portion comprises a resistor 104' identical to resistor 104, diodes D1' and D2' respectively identical to diodes D1 and D2, and current mirrors 100', 600', and 700' respectively identical to current mirrors 100, 600, and 700. Elements 104', D1', D2', 100', 600', and 700' are connected in the same way as elements 104, D1, D2, 100, 600, and 700 but by inverting input nodes IN1 and IN2.

FIGS. 9 to 12 are electric diagrams illustrating various alternative embodiments capable of further improving the operation of voltage measurement circuits described in the present application.

FIG. 9 illustrates an alternative embodiment where transistors of the differential measurement circuit are series-connected with emitter resistors. In the shown example, the measurement circuit comprises the same elements as the circuit of FIG. 1, and current-to-voltage converter 105 comprises the same elements as in the example of FIG. 2B. The circuit of FIG. 9 further comprises three resistors 901, 902, and 903 of same value $R_e$, respectively connected between the emitter of transistor 101 and node IN2, between the emitter of transistor 103 and node IN2, and series-connected with resistor 203 between the emitter of transistor 205 and resistor 203. Adding emitter resistors $R_e$ enables to limit the disparity between transistors, due to manufacturing inaccuracies. As a variation, it may be provided to suppress resistors 104 and 203, and to use the emitter resistors to define the link between input voltage $V_e$ and output current $I_s$ of the measurement circuit. The use of emitter resistors is of course not limited to the circuit of FIG. 1 and may be provided in all the measurement circuits described in the present application.

FIG. 10 is a partial electric diagram illustrating an alternative embodiment of current-to-voltage conversion circuit 105 of the measurement circuit of FIG. 9. In a current mirror with bipolar transistors, a base current $i_b$ (see FIG. 9) is consumed by each of the transistors of the mirror. Now, the bases of the bipolar transistors are only powered by the input branch (left-hand branch) of the mirror. This results in a slight asymmetry between the input branch and the output branch of the mirror, which translates as an error on output value $I_s$ or $V_s$ of the measurement circuit. As an illustration, in the circuit of FIG. 9, collector currents $i_c$ of transistors 101 and 103 are identical. Output current $I_s$ is equal to current $i_c$, but input current $I_e$ is equal to $i_c + 2i_b$. Emitter resistors 901 and 902 conducting a current equal to $i_c + i_b$, differential input voltage $V_e$ may be written as $V_e = (R_e + R1)i_e + (R_e + 2R1)i_b + V_{be}$, where $V_{be}$ is the base-emitter voltage of transistor 101, and output voltage $V_s$ may be written as $V_s = (R_e + R1)i_c + V_{be}$. $(R_e + 2R1)i_b$ is thus missing to the output voltage in order or it to be identical to the input voltage. In the alternative embodiment of FIG. 10, current-to-voltage conversion circuit 105 is capable of compensating this error. Conversion circuit 105 of FIG. 10 comprises the same elements as conversion circuit 105 of FIG. 9, and further comprises, in series between the base and the collector of transistor 205, three resistors 1001, 1002, and 1003, of respective values R1, R1, and $R_e$. Transistor 205 being selected to be substantially identical to transistors 101 and 103, its base current $i_b$ is the same as that of transistors 101 and 103. Since base current $i_b$ of transistor 205 crosses resistors 1001, 1002, and 1003, output voltage Vs can be written as $V_s = (R_e + R1)i_c + V_{be} + (R_e + 2R1)i_b$, and is thus equal to voltage $V_e$. The provision of a base current compensation is of course not limited to the circuit of FIG. 9 and may be provided in all the measurement circuits described in the present application.

In the absence of compensation, the error associated with the base current of the bipolar transistors is all the greater as the current gain of these transistors is low. To maximize the current gain, it may be provided, as illustrated in FIG. 11, to replace each of the transistors of the current mirror with a pair of two bipolar transistors of the same type connected in a Darlington assembly.

FIG. 12 illustrates another alternative embodiment of the measurement circuit of FIG. 1. Theoretically, in the circuit of FIG. 1, output transistor 103 of current mirror 100 behaves as a pure current source, and output current $I_s$ is independent from the voltage seen by transistor 103. However, in practice, output current $I_s$ slightly drifts according to the emitter-collector voltage seen by transistor 103. The higher this voltage, the greater output current $I_s$. In other words, the higher the common mode of voltage $V_e$ to be measured, the greater the drift (this is called common-mode effect). The alternative embodiment of FIG. 12 provides an element for compensating this common-mode effect. The circuit of FIG. 12 comprises the same elements as the circuit of FIG. 1 and current-to-voltage converter 105 is the same as in the example of FIG. 2B. The circuit of FIG. 12 further comprises a second current mirror 1200 comprising, on its input branch, a diode-assembled NPN bipolar transistor 1201, and, on its output branch, an NPN bipolar transistor 1203 having its base connected to the base of transistor 1201. The emitters of transistors 1201 and 1203 are connected to node GND. The collector of transistor 1201 is connected to node IN1 via a resistor 1204 of value $R_{comp}$.

The collector of transistor 1203 is connected to the collector of transistor 103. In operation, current mirror 1200 and resistor 1204 enable to subtract to output current $I_s$ of current mirror 100 a current $i_{comp}$ proportional to a voltage close to the voltage seen by transistor 103 (voltage $V_a-V_{GND}$ in this example). Resistor 1204 determines the relation between this reference voltage and current of resistor 1204 is selected according to the sensitivity of transistor 103 to $i_{comp}$. Value $R_{comp}$ of resistor 1204 is selected according to the sensitivity of transistor 103 to the common-mode effect. This value may be determined by calculation or by circuit characterization measurements. The provision of a compensation of the common-mode effect is of course not limited to the circuit of FIG. 1 and may be provided in all the measurement circuits described in the present application.

Figure 13:
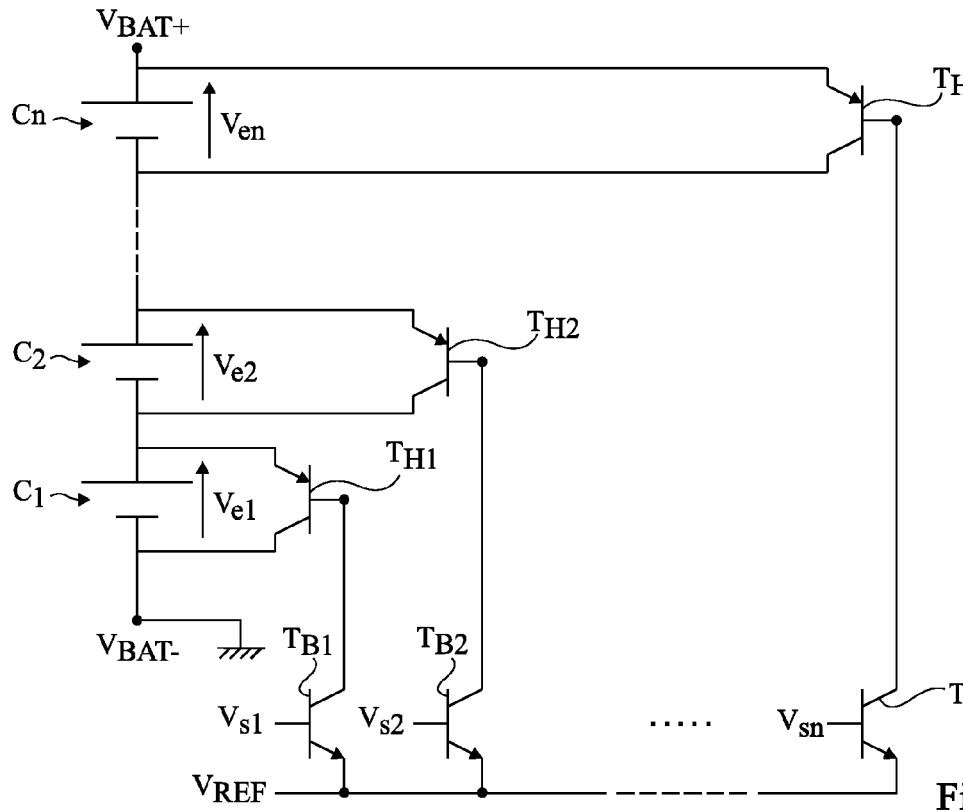
FIG. 13 is an electric diagram illustrating an example of use of a differential voltage measurement circuit in an electric battery.

FIG. 13 is an electric diagram illustrating an embodiment of an electric battery comprising a plurality of series-connected elementary cells, and means for measuring and controlling the voltage of the battery cells. In the shown example, the battery comprises n elementary cells $C_i$ in series, where i is an integer ranging from 1 to n, n being an integer greater than 1. The low potential node of first cell $C_1$ in the series is connected to a terminal $V_{BAT-}$ for providing the low potential of the battery. The high potential node of last cell $C_n$ in the series is connected to a terminal $V_{BAT+}$ for providing the high potential of the battery. Each cell $C_i$ provides a voltage $V_{ei}$ between its terminals. The voltage provided across the battery is equal to the sum of voltages $V_{ei}$ provided by the n elementary cells.

Across each elementary cell $C_i$, is connected a differential measurement circuit (not shown) of the type described in relation with FIGS. 1 to 12, providing a value representative of voltage $V_{ei}$ across the battery. In this example, each differential measurement circuit connected to a cell $C_i$ provides a voltage $V_{si}$ equal to voltage $V_{ei}$ of the cell. In this example, reference node GND common to all differential measurement circuits is connected to low potential node $V_{BAT-}$ of the battery. Each elementary cell $C_i$ further has an associated NPN bipolar transistor $T_{Bi}$ having its base receiving output voltage $V_{si}$ delivered by the measurement circuit, and a PNP bipolar transistor $T_{Hi}$. The emitter and the collector of transistor $T_{Hi}$ are respectively connected to the high potential node and to the low potential node of cell $C_i$, possibly via resistors, not shown. The base of transistor $T_{Hi}$ is connected to the collector of transistor $T_{Bi}$. An intermediate resistor, not shown, may be provided between the base of transistor $T_{Hi}$ and the high potential node of cell $C_i$. The emitter of transistor $T_{Bi}$ receives a reference potential $V_{REF}$.

In operation, when voltage $V_{si}$ exceeds voltage $V_{REF}$ completed with the turn-on voltage of transistor $T_{Bi}$, transistor $T_{Bi}$ becomes progressively conductive. This results in making transistor $T_{Hi}$ progressively conductive and causes a power dissipation across cell $C_i$, which for example enables to avoid an overcharge of the battery cells in a battery recharge operation. Threshold $V_{REF}$ may be fixed, or may progressively increase during the charge to balance the battery charge.

Figure 14:
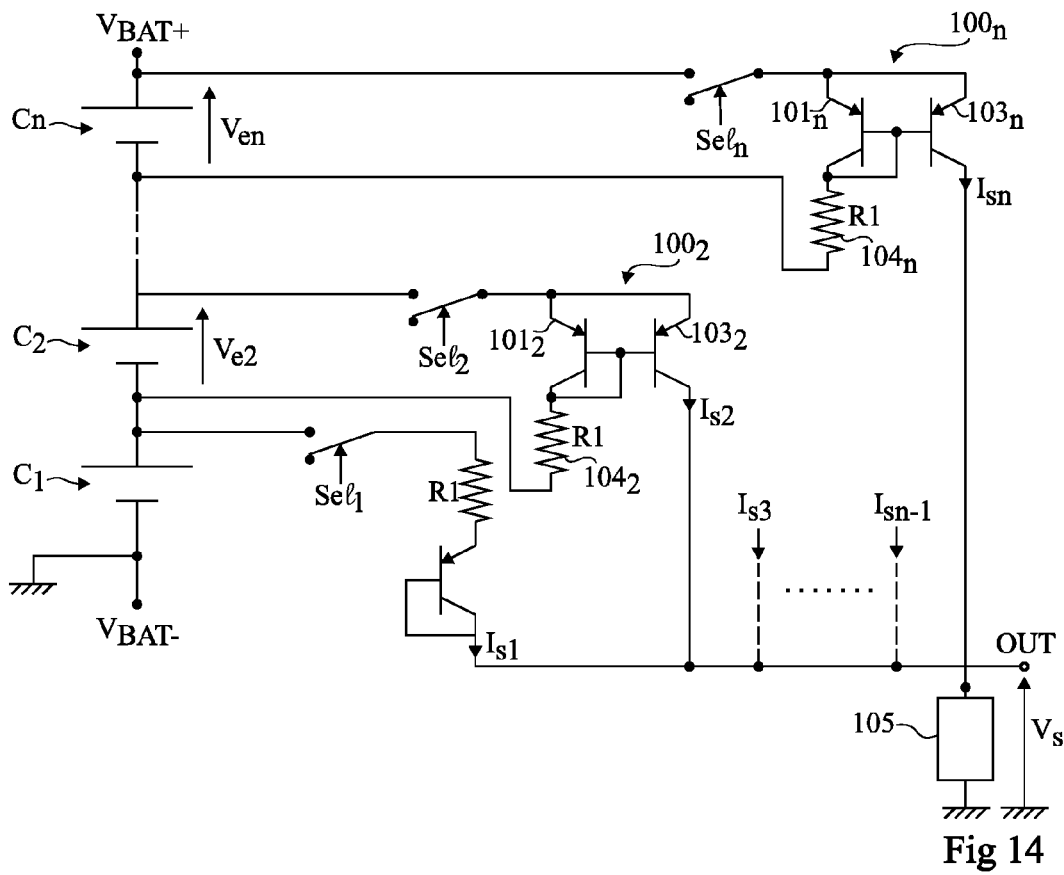
FIG. 14 is an electric diagram illustrating another example of use of a differential voltage measurement circuit in an electric battery.

FIG. 14 is an electric diagram illustrating another embodiment of an electric battery comprising a plurality of series-connected elementary cells, and means for measuring and controlling the voltage of the battery cells. In the shown example, the battery comprises n series-connected elementary cells $C_i$, where i is an integer ranging from 1 to n, n being an integer greater than 1. The low potential node of first cell $C_1$ in the series is connected to a terminal $V_{BAT-}$ for providing the low potential of the battery. The high potential node of last cell $C_n$ in the series is connected to a terminal $V_{BAT+}$ for providing the high potential of the battery. Each cell $C_i$ provides a voltage $V_{ei}$ between its terminals. The voltage provided across the battery is equal to the sum of voltages $V_{ei}$ provided by the n elementary cells.

Each elementary cell $C_i$ has a differential measurement circuit of the type described in relation with FIGS. 1 to 12 connected thereacross. In the shown example, each differential measurement circuit is a circuit of the type described in relation with FIG. 1, comprising a current mirror $100_i$ with two transistors $101_i$ and $103_i$, and a resistor $104_i$ of value R1 in series with transistor $101_i$. According to an aspect of the embodiment of FIG. 14, current-to-voltage conversion element 105 of the circuit of FIG. 1 is shared between all the differential measurement circuits of the battery. In this example, the collectors of transistors $103_i$ of all the differential measurement circuits are connected to the same current-to-voltage conversion element 105. A switch $Sel_i$ is placed between the high potential node of each battery cell and the emitter of transistor $101_i$ of the differential measurement circuit associated with this cell. Control means, not shown, for example comprising a calculator, enable to control switches $Sel_i$. In operation, when the voltage of a cell $C_i$ of the battery is desired to be measured, switch $Sel_i$ associated with this cell is turned on, and the switches associated with the other cells are turned off. Voltage $V_s$ between output node OUT of element 105 and the ground is then representative of the voltage across cell $C_i$.

An advantage of the embodiment of FIG. 14 is that it enables to limit the number of current-to-voltage conversion elements 105. Further, the number of digital-to-analog converters necessary to sample output voltage $V_s$ of element 105 is also decreased.

Specific embodiments of the present invention have been described. Various alterations, modifications, and improvements will readily occur to those skilled in the art.

In particular, the present invention is no limited to the specific use, described in relation with FIG. 13, of the differential measurement circuits described in the present application. More generally, the present invention is not limited to a use of the described differential measurement circuits in electric batteries. The differential measurement circuits described in the present application may especially be used in photovoltaic generator type, fuel cell type, or other applications. In the case of a use in an electric battery, it will be within the abilities of those skilled in the art to provide other ways to use variable $I_s$ or $V_s$ provided by the differential measurement circuit to control the battery cells than that described in relation with FIG. 13. As an example, variable $I_s$ or $V_s$ may be sampled and used by a digital calculator configured to control the battery cells. Further, the battery does not necessarily comprise as many differential measurement circuits as elementary cells. A multiplexer may thus be provided to share a differential measurement circuit or a portion of a differential measurement circuit between several cells of the battery. As an example, a same current-to-voltage conversion element may be shared between several differential measurement circuits by means of a multiplexer, which for example enables to measure all the voltages of the battery pack with a single analog-to-digital converter. Further, to avoid an unnecessary power consumption by the measurement circuit, a switch may be provided to deactivate the measurement circuit when it is not used.

Further, it will be within the abilities of those skilled in the art to form all the measurements circuits described in the present application by using other types of transistors than bipolar transistors, for example, MOS, FET, or JFET transistors. As an example, the PNP and NPN bipolar transistors may be respectively replaced with P-channel MOS transistors and with N-channel MOS transistors, with the source, gate, and drain connections of the MOS transistors respectively replacing the emitter, base, and collector connections of the bipolar transistors. MOS transistors being bidirectional components for the current flowing therethrough, complementary diodes may in certain cases be necessary to provide the branching of currents. As an example, in the specific case of the circuit of FIG. 4, four additional diodes may respectively be provided between transistor 101 and resistor 104, the anode of diode being on the side of transistor 101, between transistor 103 and circuit 105, the diode anode being on the side of transistor 103, between transistor 401 and resistor 404, the diode anode being on the side of transistor 401, and between transistor 403 and circuit 105, the diode anode being on the side of transistor 403. Such diodes enable to branch the input current into current mirror 100 when voltage $V_e$ is positive, and into current mirror 400 when voltage $V_e$ is negative.

Further, it will be within the abilities of those skilled in the art to combine various elements of the various embodiments and variations described hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A voltage measurement circuit comprising:
   first and second nodes of application of a voltage to be measured; and
   a current mirror comprising:
   a first transistor having first and second conducting nodes and a control node;
   a second transistor having first and second conducting nodes and a control node, wherein:
   the first conducting node of the first transistor is connected, or coupled through at least one of a resistor and a diode, to the first node of application of the voltage to be measured;
   the second conducting node of the first transistor is connected, or coupled through a diode, to a first node of a first resistive element;
   the second node of the first resistive element is coupled to the second node of application of the voltage to be measured;
   the control node of the first transistor is connected to the second conducting node of the first transistor;
   the control node of the second transistor is connected to the control node of the first transistor; and
   the first conducting node of the second transistor is connected, or coupled through at least one of a resistor and a diode, to the first node of application of the voltage to be measured.

2. The circuit of claim 1, wherein an output branch of the current mirror is located between the first node of application of the voltage to be measured and a third node of application of a reference voltage.

3. The circuit of claim 1, wherein an output branch of the current mirror comprises the second transistor that provides a current representative of the voltage to be measured, the circuit further comprising an element for converting said current into an output voltage.

4. The circuit of claim 3, wherein the conversion element comprises a second resistive element of same value as the first resistive element and, series-connected with the second resistive element, a branch comprising at least an additional transistor identical to the first transistor of the current mirror.

5. The circuit of claim 1, wherein each transistor of the current mirror is series-connected with a resistor.

6. The circuit of claim 1, wherein the transistors of the current mirror are bipolar transistors, the circuit further comprising a circuit for compensating the base current of the transistors of the current mirror.

7. The circuit of claim 1, further comprising a circuit for compensating the common-mode effect on an output branch of the current mirror.

8. An electric battery comprising a plurality of series-connected elementary cells and, across at least one elementary cell, the measurement circuit of claim 1.

9. The battery of claim 8, wherein said measurement circuit is used to control the voltage of said cell.

10. The circuit of claim 1, wherein the first transistor is a diode-assembled transistor.

11. The voltage measurement circuit of claim 1, wherein:
    the first conducting node of the first transistor (101) is connected to the first node (IN2) of application of the voltage to be measured;
    the second conducting node of the first transistor (101) is connected to the first node of the first resistive element (R1); and
    the first conducting node of the second transistor (103) is connected to the first node (IN2) of application of the voltage to be measured.

12. The voltage measurement circuit of claim 1, wherein:
    the second node of the first resistive element (R1) is connected to the second node (IN1) of application of the voltage to be measured.

* * * * *